US010892206B2

(12) United States Patent
Joshi

(10) Patent No.: US 10,892,206 B2
(45) Date of Patent: Jan. 12, 2021

(54) METHODS OF FORMING POWER ELECTRONIC ASSEMBLIES USING METAL INVERSE OPAL STRUCTURES AND ENCAPSULATED-POLYMER SPHERES

(71) Applicant: Toyota Motor Engineering & Manufacturing North America, Inc., Plano, TX (US)

(72) Inventor: Shailesh N. Joshi, Ann Arbor, MI (US)

(73) Assignee: TOYOTA MOTOR ENGINEERING & MANUFACTURING NORTH AMERICA, INC., Plano, TX (US)

(*) Notice: Subject to any disclaimer, the term of this patent is extended or adjusted under 35 U.S.C. 154(b) by 20 days.

(21) Appl. No.: 16/250,743

(22) Filed: Jan. 17, 2019

(65) Prior Publication Data

US 2020/0235032 A1 Jul. 23, 2020

(51) Int. Cl.
*H01L 23/373* (2006.01)
*C23C 28/02* (2006.01)
*H01L 23/488* (2006.01)

(52) U.S. Cl.
CPC ........ *H01L 23/3735* (2013.01); *C23C 28/027* (2013.01); *C23C 28/028* (2013.01); *H01L 23/3736* (2013.01); *H01L 23/488* (2013.01); *G02F 2202/32* (2013.01)

(58) Field of Classification Search
CPC combination set(s) only.
See application file for complete search history.

(56) References Cited

U.S. PATENT DOCUMENTS

| 7,660,029 B2* | 2/2010 | Ashrit ................. G02F 1/1524 359/265 |
| 8,147,981 B2 | 4/2012 | Lang et al. |
| 2014/0011014 A1* | 1/2014 | King ...................... C25D 7/00 428/312.2 |
| 2014/0017145 A1* | 1/2014 | Aizenberg ........... C08G 59/502 422/425 |
| 2017/0062304 A1 | 3/2017 | Joshi et al. |

FOREIGN PATENT DOCUMENTS

| CN | 100446309 C | 12/2008 |
| CN | 201629283 U | 11/2010 |
| CN | 102745907 B | 9/2014 |
| JP | 6374072 B1 | 8/2018 |
| WO | 2018031821 A1 | 2/2018 |

* cited by examiner

*Primary Examiner* — Ratisha Mehta
(74) *Attorney, Agent, or Firm* — Dinsmore & Shohl LLP

(57) ABSTRACT

A method of forming a bonding assembly that includes positioning a plurality of polymer spheres against an opal structure and placing a substrate against a second major surface of the opal structure. The opal structure includes the first major surface and the second major surface with a plurality of voids defined therebetween. The plurality of polymer spheres encapsulates a solder material disposed therein and contacts the first major surface of the opal structure. The method includes depositing a material within the voids of the opal structure and removing the opal structure to form an inverse opal structure between the first and second major surfaces. The method further includes removing the plurality of polymer spheres to expose the solder material encapsulated therein and placing a semiconductor device onto the inverse opal structure in contact with the solder material.

20 Claims, 8 Drawing Sheets

METHODS OF FORMING POWER ELECTRONIC ASSEMBLIES USING METAL INVERSE OPAL STRUCTURES AND ENCAPSULATED-POLYMER SPHERES

BACKGROUND

Field

The present specification generally relates to power electronics assemblies, and more particularly, to methods of forming power electronics assemblies with bonding layers that include encapsulated bonding spheres therein that provide electrical contact between electrodes, cooling of semiconductor devices, and thermal stress compensation.

Technical Background

As power electronics devices are designed to operate at increased power levels, thereby generating more heat due to the demands of electrical systems, conventional heat sinks are unable to adequately remove sufficient heat to effectively lower the operating temperature of the power electronics devices to acceptable temperature levels. Further, conventional heat sinks and cooling structures require additional bonding layers and thermal matching materials (e.g., bond layers, substrates, thermal interface materials). These additional layers add substantial thermal resistance to the overall assembly and make thermal management of the electronics system challenging.

Metal inverse opal (MIO) structures provide a thermal management of the assembly due to a general porosity of the structure, which enables enhanced nucleation sites for receiving a cooling fluid therein. However, due to the multiple pores (i.e., voids) present within the MIO structure, bonding the components of the power electronics assembly to the MIO structure may be challenging.

SUMMARY

In one embodiment, a method of forming a bonding assembly includes positioning a plurality of polymer spheres against an opal structure, wherein the opal structure includes a first major surface and a second major surface with a plurality of voids defined therebetween. The plurality of polymer spheres encapsulates a solder material disposed therein and contacts the first major surface of the opal structure. The method further includes placing a substrate against the second major surface of the opal structure, depositing a material within the voids of the opal structure, and removing the opal structure to form an inverse opal structure between the first and second major surfaces. The method further includes removing the plurality of polymer spheres to expose the solder material encapsulated therein and placing a semiconductor device onto the inverse opal structure in contact with the solder material.

In another embodiment, a method of forming a power electronic assembly includes attaching a metal substrate to a first surface of an opal structure, the opal structure including a plurality of voids defined between the first surface and a second surface. The method further includes attaching a plurality of polymer spheres to the second surface of the opal structure, the plurality of polymer spheres encapsulating a solder material disposed therein, and forming an inverse opal structure between the metal substrate and the plurality of polymer spheres by removing the opal structure disposed therebetween. The method further includes exposing the solder material from within the plurality of polymer spheres by removing the plurality of polymer spheres and securing a non-metal substrate against the inverse opal structure and in contact with the solder material.

In yet another embodiment, a method for bonding a semiconductor device to a substrate using metal inverse opals, the method including depositing the substrate onto a first major surface of an opal structure, wherein the opal structure defines a plurality of voids between the first major surface and a second major surface of the opal structure. The method further includes receiving a plurality of polymer spheres within at least one of the plurality of voids of the opal structure, electrodepositing metal within the plurality of voids of the opal structure to bond the substrate to the opal structure, and dissolving the opal structure to provide a metal inverse opal structure secured along the substrate, the metal inverse opal structure defining a plurality of spheres. The method further includes dissolving the plurality of polymer spheres from within the metal inverse opal structure to expose an encapsulated material positioned within the plurality of polymer spheres and depositing the semiconductor device onto the metal inverse opal structure to bond the substrate to the semiconductor device.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like structure is indicated with like reference numerals and in which:

DETAILED DESCRIPTION

Figure 1:
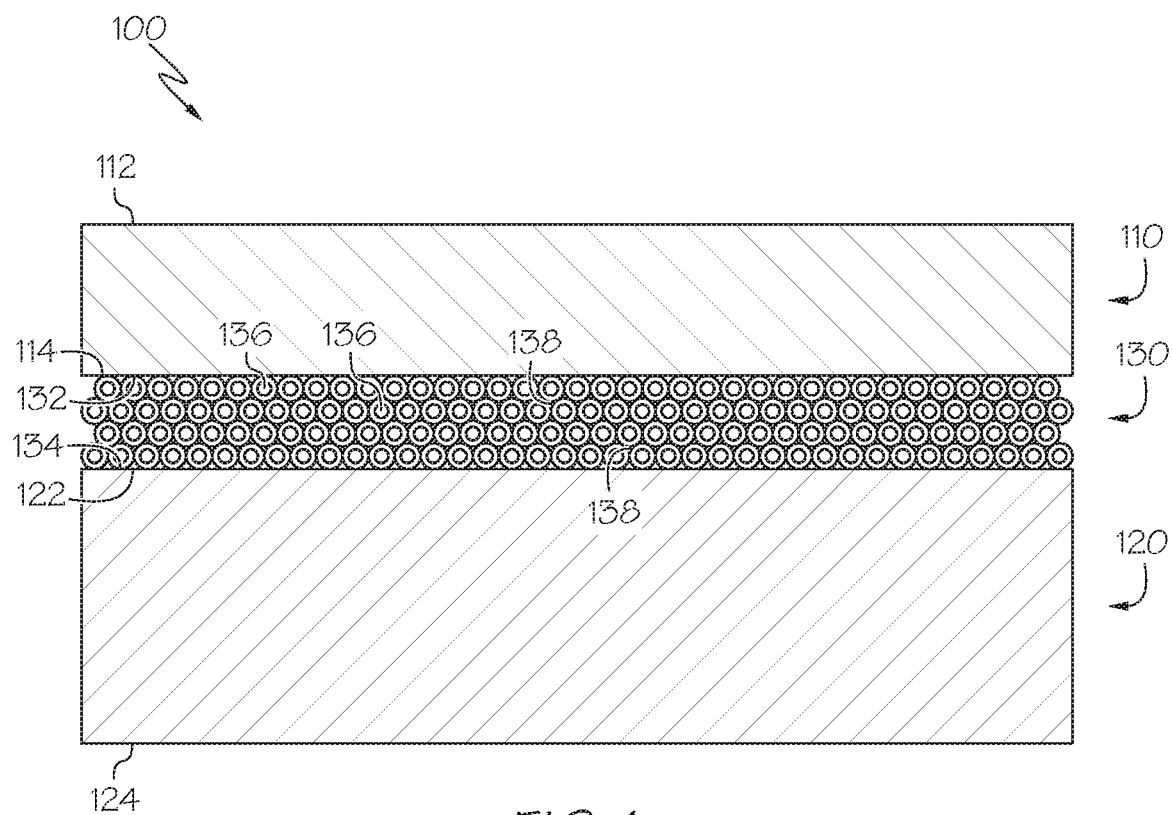
FIG. 1 schematically depicts an illustrative cross-sectional side view of an assembly having a metal substrate thermally bonded to a device substrate with a metal inverse opal structure disposed therebetween according to one or more embodiments shown and described herein.

Power electronics devices are often utilized in high-power electrical applications, such as inverter systems for hybrid electric vehicles and electric vehicles. Such power electronics devices include power semiconductor devices such as power insulated-gate bipolar transistors (IGBTs) and power transistors thermally bonded to a metal substrate. With advances in battery technology and increases in electronics device packaging density, operating temperatures of power electronics devices have increased and can exceed about 200° Celsius. Heat sink devices or other similar thermal transfer devices may be coupled to the power electronics devices to remove heat and lower the maximum operating temperature of a power semiconductor device. For example, cooling fluid may be used to receive heat generated by the power semiconductor device by convective thermal transfer, and remove such heat from the power semiconductor device.

It should be understood that the substrates (e.g., power semiconductor devices) and assemblies (e.g., power electronics assemblies) described herein may be incorporated into an inverter circuit or system that converts direct current electrical power into alternating current electrical power and vice versa depending on the particular application. For example, in a hybrid electric vehicle application (not shown), several power electronics assemblies may be electrically coupled together to form a drive circuit that converts direct current electrical power provided by a bank of batteries into alternating electrical power that is used to drive an electric motor coupled to the wheels of a vehicle to propel the vehicle using electric power. The power electronics assemblies used in the drive circuit may also be used to convert alternating current electrical power resulting from use of the electric motor and regenerative braking back into direct current electrical power for storage in the bank of batteries.

Power semiconductor devices may generate a significant amount of heat during operation, which require bonds between the semiconductor device and the metal substrate that can withstand higher temperatures and thermally-induced stresses due to CTE mismatch. The MIO bonding structures described and illustrated herein may compensate for the thermally-induced stresses generated during thermal bonding of the semiconductor devices to the metal substrate by manageably controlling the thermal expansion and/or stiffness experienced by the layers of the metal substrate and semiconductor devices while also providing a compact package design. The MIO bonding structure may also provide an electrically conductive path between the semiconductor device and the substrate, and in some embodiments, a pair of electrodes disposed along the semiconductor device and the substrate. The MIO bonding structure may further provide a cooling layer for cooling the semiconductor devices during operation of the power electronics devices.

The present disclosure relates generally to a simplified method for forming the power electronic devices described above including a power semiconductor device bonded to a metal substrate with a MIO bonding structure disposed therebetween. One non-limiting example of a method for forming an assembly (e.g., a power electronics assembly) includes positioning a plurality of polymer spheres against an opal structure along a first major surface thereof and positioning a substrate against the opal structure along a second major surface thereof. A material, such as a metal (e.g., copper), may be deposited onto the opal structure such that the metal is received through a plurality of voids of the opal structure. In this instance, removing the opal structure, for example, by dissolving the opal structure, forms a metal inverse opal (MIO) bonding structure secured against the substrate and the plurality of polymer spheres. Removing the plurality of polymer spheres exposes a solder material disposed within the plurality of polymer spheres.

With the MIO bonding structure formed against the substrate and with the solder material exposed along the first major surface of the MIO bonding structure, a semiconductor device may be positioned on the MIO bonding structure along the first major surface thereof opposite of the substrate located along the second major surface thereof. Accordingly, the semiconductor device is positioned in contact with or adjacent to the solder material. The semiconductor device may be bonded to the MIO bonding structure and the substrate, for example, by heating the assembly and melting the solder material to secure the semiconductor device to the MIO bonding structure, thereby forming the assembly.

The MIO bonding structure may serve as an electrically conductive layer between the substrate and the semiconductor device such that the substrate may be in electrical communication with the semiconductor device through the porous MIO bonding structure. The MIO bonding structure includes a porous structure defining a series of interconnected voids extending therethrough. Additionally, the MIO bonding structure may provide a thermally conductive cooling layer for the assembly such that a cooling fluid may enter the assembly and flow through the porous structure of the MIO bonding structure, and in particular through the interconnected voids defined within the MIO bonding structure, to cool the substrate and/or the semiconductor device. The MIO bonding structure may provide a thermal stress compensation layer to the bonding assembly and may be incorporated into inverter systems of electrified vehicles described herein to reduce thermally-induced stresses due to CTE mismatch without the need for additional interface layers. Various embodiments of opal structures, polymer spheres, MIO bonding structures and bonding assemblies will be described in greater detail herein.

Referring initially to FIG. 1, a non-limiting example of an assembly 100, such as, for example, a power electronics assembly, is illustrated. The example assembly 100 generally includes a semiconductor device 110 with a top surface 112 and a bottom surface 114, and a substrate 120 with a top surface 122 and a bottom surface 124. An inverse opal bonding structure 130 (e.g., metal inverse opal bonding structure) with a first major surface 132 and a second major surface 134 is positioned between and bonded to the semiconductor device 110 and the substrate 120. In particular, the top surface 122 of the substrate 120 is bonded to the MIO bonding structure 130 along the second major surface 134, and the bottom surface 114 of the semiconductor device 110 is bonded to the MIO bonding structure 130 along the first major surface 132. As will be described in greater detail herein, the MIO bonding structure 130 may be formed and bonded to the semiconductor device 110 by depositing a plurality of polymer spheres 150 along the first major surface 132 of the MIO bonding structure 130 (FIG. 2A) such that the semiconductor device 110 is in contact with and/or positioned adjacent to the plurality of polymer spheres 150 (FIG. 2D) when bonded thereto. In other embodiments, the plurality of polymer spheres 150 may be deposited within the MIO bonding structure 130 and/or about an exterior of the MIO bonding structure 130. The MIO bonding structure 130 may be formed and bonded to the substrate 120 by depositing a metal (e.g., copper) along an opal structure 140 (FIGS. 2A-2B) that is positioned against the substrate 120 prior to attachment of the semiconductor device onto the assembly 100.

Still referring to FIG. 1, the semiconductor device 110 may generally be any electronic device that uses semiconductor materials. In some embodiments, the semiconductor device 110 may be formed from a wide band gap semiconductor material suitable for the manufacture or production of power semiconductor devices, such as, for example, a power insulated-gate bi-polar transistor (IGBTs), a power metal-oxide field-effect transistor (MOSFET), a power transistor, and the like. In some embodiments, the semiconductor device 110 may be formed from wide band gap semiconductor materials. Non-limiting examples of such wide band gap semiconductor materials include silicon carbide (SiC), aluminum nitride (AlN), gallium nitride (GaN), gallium oxide ($Ga_2O_3$), boron nitride (BN), diamond, and/or the like.

The substrate 120 serves as a bottom substrate for the assembly 100 and may be formed of any type of material, particularly those that are used for power semiconductor device assemblies. Non-limiting examples include metal substrates, e.g., substrates formed from copper (Cu), e.g., oxygen free Cu, aluminum (Al), Cu alloys, Al alloys, and the like, direct bonded copper substrates or semiconductor (e.g., silicon) substrates. In embodiments, the substrate 120 may be plated with a metal on an exterior surface, such as, for example, aluminum (Al), nickel (N), and the like. As will be described in greater detail herein, the substrate 120 may be formed from a thermally conductive material such that heat from the semiconductor device 110 is transferred to the substrate 120 via the MIO bonding structure 130 interlaid between the semiconductor device 110 and the substrate 120.

The thickness of the semiconductor device 110 and the substrate 120 may depend on the intended use of the assembly 100. In non-limiting examples, the semiconductor device 110 has a thickness of about 0.1 millimeters to about 0.3 millimeters, and the substrate 120 has a thickness of about 1.0 millimeter to about 2.0 millimeters. In this instance, the assembly 100 may have a maximum height of about 1.1 millimeters to about 2.3 millimeters. It should be understood that other thicknesses of the semiconductor device 110 and/or the substrate 120 may be utilized in assembly 100 without departing from the scope of the present disclosure.

The MIO bonding structure 130 may generally be any inverse opal structure, such as, for example, a copper inverse opal (CIO) structure, a nickel inverse opal (NIO) structure, and/or the like. The MIO bonding structure 130 has a plurality of pores 136 that define a porosity of the MIO bonding structure 130. The plurality of pores 136 may facilitate a thermal conductivity for the MIO bonding structure 130 between the semiconductor device 110 and the substrate 120. In particular, the plurality of pores 136 define a plurality of dimples 138 (or other similar depressions or indentations) such that fluid introduced into the assembly 100 can flow through each of the plurality of networked pores 136 throughout the MIO bonding structure 130 and contact a greater amount of surface area for the purposes of heat transfer. Such fluid may include a cooling fluid received through the plurality of pores 136 and transferred through the MIO bonding structure 130 to contact the bottom surface 114 of the semiconductor device 110 and the top surface 122 of the substrate 120 to transfer heat generated by the semiconductor device 110 while in use and cool the overall assembly 100.

In other words, as fluid flows through the plurality of pores 136 and/or other surface features of the MIO bonding structure 130, latent heat of the assembly 100 is absorbed by the fluid due to the relative cooler temperature of the fluid. Additionally, with the heat effectively absorbed by the fluid received through the porous structure of the MIO bonding structure 130, the heat is transferred through the MIO bonding structure 130 with the movement of the fluid to other portions of the assembly 100 to draw the heat away from the one or more heat generating devices (i.e., the semiconductor device 110). In some embodiments, heat can be transferred to the fluid from the MIO bonding structure 130 such that the fluid carries the heat away from the semiconductor device 110. While the plurality of pores 136 of the present example are specifically shown and described herein as defining a series of dimples 138 throughout the MIO bonding structure 130, other surface features contained within the MIO bonding structure 130 may also be included without departing from the scope of the present disclosure.

The number of pores 136 and/or other surface features present in the MIO bonding structure 130 is not limited by the present disclosure, and may be any number so long as the connectivity between the material of the MIO bonding structure 130 and the top surface 122 of the substrate 120 and the bottom surface 114 of the semiconductor device 110 is maintained. While the plurality of pores 136 are depicted as being generally spherical in shape, this is merely illustrative. Accordingly, it should be understood that the plurality of pores 136 may be any shape, including, for example, spherical, cylindrical, and/or irregular shapes. The shape of the pores 136 may be determined from the shape of the materials used to form the MIO bonding structure 130 (i.e., the type of metal). Further, the thickness of the MIO bonding structure 130 is not limited by the present disclosure, and may generally be any thickness.

As briefly described above, the MIO bonding structure 130 may generally be constructed of a thermally conductive material, but is otherwise not limited by the present disclosure. In some embodiments, the material used for the MIO bonding structure 130 may be selected based on the process used to form the MIO bonding structure 130, as described in greater detail herein. For example, if the MIO bonding structure 130 is formed from an MIO formation process, metals that are suitable for such a formation process may be used. Illustrative examples of materials that may be used include, but are not limited to, aluminum, nickel, copper, silver, gold, an alloy containing any of the foregoing, a compound containing any of the foregoing, and the like. Other materials that are generally understood to result from an inverse opal formation process that are not specifically disclosed herein are also included within the scope of the present disclosure.

It should be understood that inverse opal structures (including MIO structures) have a high permeability, as inverse opal wick structures provide the advantage of improved control over pore sizes and distribution. Accordingly, the thermal conductivity of the MIO bonding structure 130 can be varied and controlled to accommodate thermomechanical stresses generated within the assembly 100. In some embodiments, the MIO bonding structure 130 is further configured to provide heat flux thermal management within the assembly 100 such that the MIO bonding structure 130 may improve heat exchange between the semiconductor device 110 and the substrate 120 at a high heat removal rate. It should be understood that in other embodiments, the assembly 100 may include other arrangements and/or configurations than that shown and described above, as described herein below.

Figure 2A:
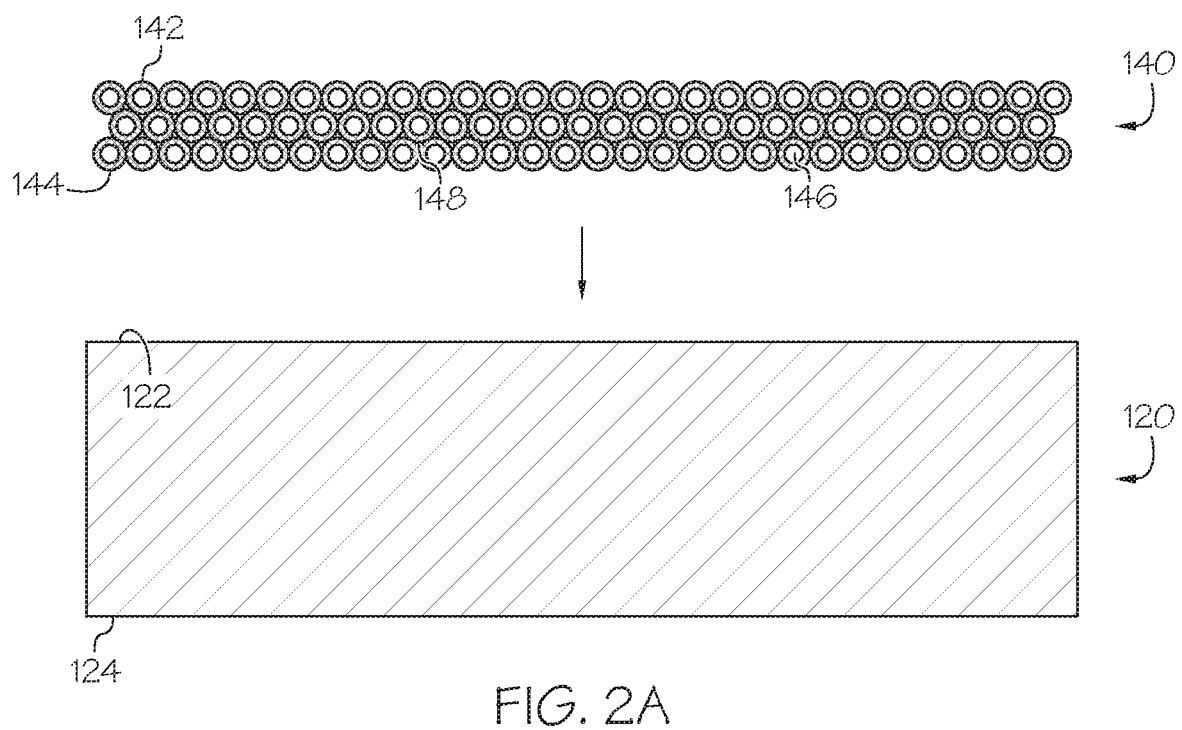
FIG. 2A schematically depicts a method of fabricating the assembly of FIG. 1 by positioning an opal structure against a plurality of polymer spheres according to one or more embodiments shown and described herein.

Referring now to FIGS. 2A-2D and the flow chart of FIG. 4, an example method 200 for forming the assembly 100 with the opal structure 140 generally described above is shown. It should be understood that method 200 is merely illustrative and that the assembly 100 may be formed via other methods. At block 202, and as depicted in FIG. 2A, the substrate 120 is positioned against the opal structure 140, and in particular, the top surface 122 of the substrate 120 is disposed on the second major surface 144 of the opal structure 140. In some embodiments, the substrate 120 is electrodeposited onto the opal structure 140. It should be understood that in other embodiments, the substrate 120 may be deposited on the second major surface 144 of the opal structure 140 after positioning a plurality of polymer spheres 150 against the first major surface 142 of the opal structure 140.

Figure 2B:
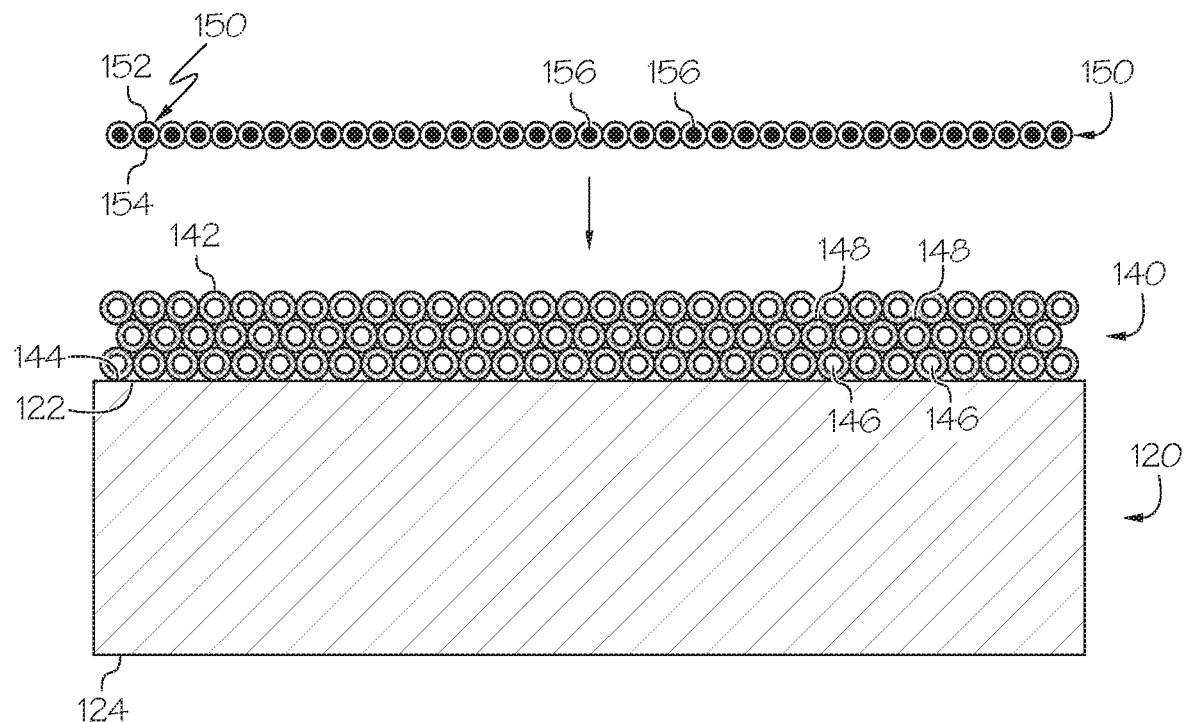
FIG. 2B schematically depicts a method of fabricating the assembly of FIG. 1 by positioning a metal substrate against the opal structure according to one or more embodiments shown and described herein.

At block 204, and as depicted in FIG. 2B, the plurality of polymer spheres 150 are positioned on and against the opal structure 140 opposite of the substrate 120. In particular, the first major surface 142 of the opal structure 140 is positioned against the bottom surface 154 of the plurality of polymer spheres 150. In this instance, the plurality of polymer spheres 150 and the opal structure 140 are not bonded together by an intermediary bonding layer disposed therebetween. However, it should be understood that the opal structure 140 and the plurality of polymer spheres 150 may be bonded together with an intermetallic compound layer formed therebetween in other embodiments. It should further be understood that in some embodiments the plurality of polymer spheres 150 may initially be deposited on the semiconductor device 110 (FIG. 2D), and in particular along the bottom surface 114, prior to being deposited along the first major surface 142 of the opal structure 140. In this instance, the semiconductor device 110 and the plurality of polymer spheres 150 are electroplated and/or electrolytically deposited onto the opal structure 140.

In some embodiments, the opal structure 140 includes a plurality of spheres 148 (e.g., polymer spheres) extending between the first major surface 142 and the second major surface 144 and forming a plurality of voids 146 disposed between the plurality of spheres 148. It should be understood that several methods of constructing the opal structure 140 are possible. One illustrative method to synthesize the opal structure 140 is via a controlled withdrawal process whereby a colloidal suspension of spheres 148 is provided via a tube, a substrate is inserted into the suspension in order to create a meniscus line within the tube, and the suspending agent (e.g., water) is slowly evaporated. The surface tension of the evaporating suspending agent at the top of the meniscus line pulls the spheres 148 into a closely packed array no more than a few layers thick, leaving the opal structure 140 of spheres 148 within the tube. This opal structure 140 of spheres 148, as depicted in FIGS. 2A-2B, is arranged such that a plurality of voids 146 are present around each of the spheres 148 of the opal structure 140. The opal structure 140 is generally constructed of a material that can later be dissolved, etched, or otherwise removed without altering the shape of the spheres 148, voids 146, and/or other surface features, as described herein. For example, in some embodiments the material of the opal structure 140 may be a polymer. In some embodiments, the opal structure 140 may be a self-assembled patterned structure.

As particularly depicted in FIGS. 2A-2B, the plurality of spheres 148 are positioned throughout the opal structure 140 to form an interconnected network of voids 146 throughout the opal structure 140. The plurality of spheres 148 are arranged to receive a material within the plurality of voids 146, such as, for example, a metal, to form the MIO bonding structure 130. As will be described in greater detail herein, the plurality of polymer spheres 150 may be disposed within the plurality of voids 146 of the opal structure 140, may extend along the sides and/or an exterior of the opal structure 140, and/or the like. The plurality of polymer spheres 150 includes a solder material (i.e., a bonding material) disposed therein, respectively, and in particular each polymer sphere 150 of the plurality of polymer spheres 150 includes a solder sphere 156 disposed between a top surface 152 of the polymer sphere 150 and a bottom surface 154 of the polymer sphere 150. The plurality of solder spheres 156 may be formed of a bonding material, such as, for example, tin. Accordingly, it should be understood that the solder sphere 156 formed of a solder bonding material, such as, for example, tin, is encapsulated within each of the polymer spheres 150 of the plurality of polymer spheres 150.

At block 206, with the substrate 120 secured against the opal structure 140 and the plurality of polymer spheres 150 disposed over the opal structure 140 opposite of the substrate 120, a material may be deposited on the opal structure 140. In particular, a metal may be electrolytically or electrolessly deposited onto the opal structure 140. In this instance, the metal is received in and transferred through the structure of the opal structure 140 via one or more surfaces of the opal structure 140 except for the second major surface 134 secured to the top surface 122 of the substrate 120 (e.g., first major surface 132, a side surface, and the like). Accordingly, the metal is received along the plurality of spheres 148 such that the metal fills the voids 146 around the spheres 148 of the opal structure 140. The metal may be formed from any electrically conductive material, such as, for example, copper (Cu), aluminum (Al), nickel (Ni), iron (Fe), zinc (Zn), alloys thereof, and the like. As used herein, the term "alloys thereof" refers to alloys not limited to the elements listed unless otherwise stated. For example, a Cu alloy as disclosed herein may include an alloy formed from Cu and elements other than Al, Ni, Fe, and Zn. In the alternative, a Cu alloy as disclosed herein may include an alloy formed from Cu with Al, Ni, Fe and/or Zn, plus additional elements. In another alternative, a Cu alloy as disclosed herein may include an alloy formed from only Cu and Al, Ni, Fe and/or Zn plus any incidental impurities present from manufacturing of the Cu alloy. It should be understood that the metal that is deposited is generally the material that results in the MIO bonding structure 130 (FIG. 1) described herein.

The metal may be deposited via any generally recognized method of deposition, such as, for example, chemical vapor deposition (CVD), electrodeposition, epitaxy, and thermal oxidation. In some embodiments, physical vapor deposition (PVD) or casting may also be used to deposit the metal. It should be understood that the deposition process does not completely fill the interstitial spaces (e.g., the plurality of voids 146), but rather creates a layer of material around the plurality of spheres 148 such that, when removed, the plurality of pores 136, the plurality of dimples 138, and/or other surface features of the MIO bonding structure 130 (FIG. 1) are formed.

At block 208, the opal structure 140 is removed from between the substrate 120 and the plurality of polymer spheres 150 to form a patterned structure therein, and in particular, the MIO bonding structure 130 within the assembly 100. In other words, with the metal received within the plurality of voids 146 and around the plurality of spheres 148 of the opal structure 140, metal inverse opals are effectively formed on the substrate 120, and in particular, along the top surface 122 of the substrate 120 where the opal structure 140 engages the substrate 120. Removal of the opal structure 140 may generally be completed via any removal processes, particularly removal processes that are suitable for removing the material used for the opal structure 140 (e.g., a polymer) but not the metal received therein. For example, an etching process may be used to remove the opal structure 140. That is, an etchant (i.e., solution) may be applied to the opal structure 140 (e.g., by placing the opal structure 140 in an etchant bath) to etch away the opal structure 140. In some embodiments, a hydrofluoric acid solution may be used as an etchant to etch away the opal structure 140. Other methods that cause the opal structure 140 to be removed or otherwise dissolved should generally be understood. As a result of this process, the MIO bonding structure 130 is formed on the top surface 122 of the substrate 120. Other methods that cause the opal structure 140 to be removed or otherwise dissolved should generally be understood.

Figure 2C:
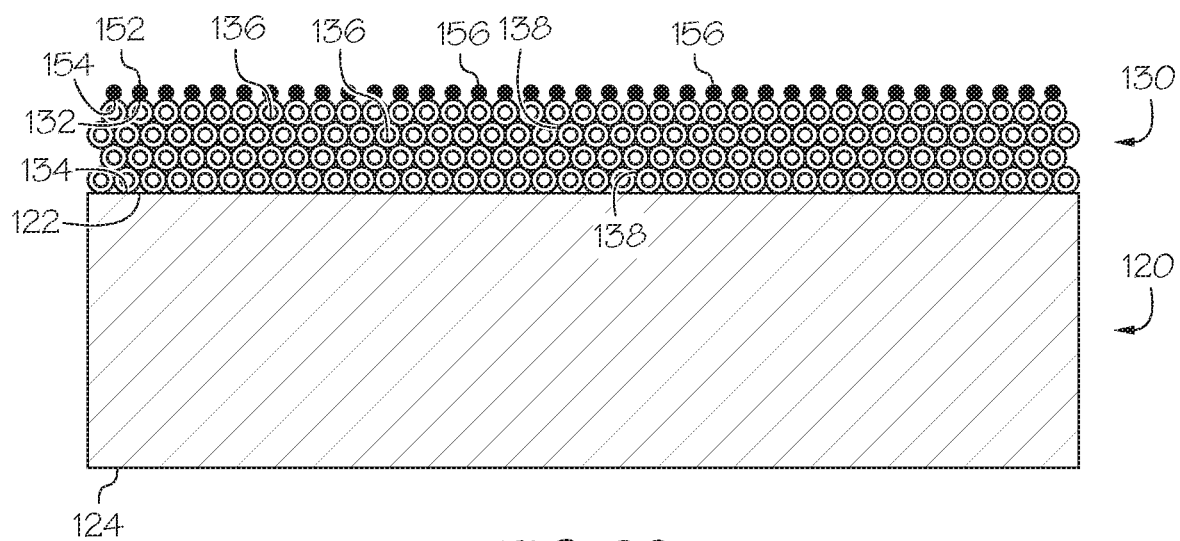
FIG. 2C schematically depicts a method of fabricating the assembly of FIG. 1 by depositing a metal within the opal structure and dissolving the opal structure and the plurality of polymer spheres to form a metal inverse opal structure with a solder material exposed along a surface of the metal inverse opal structure according to one or more embodiments shown and described herein.

Referring now to FIG. 2C, the MIO bonding structure 130 is disposed between and bonded to the substrate 120 and the plurality of polymer spheres 150. In particular, the first major surface 142 of the opal structure 140 is effectively the first major surface 132 of the MIO bonding structure 130 such that the first major surface 132 is bonded to the top surface 122 of the substrate 120. The second major surface 144 of the opal structure 140 is the second major surface 134 of the MIO bonding structure 130, upon removal of the opal structure 140, such that the second major surface 134 is bonded to the bottom surface 154 of the plurality of polymer spheres 150. It should be understood that in other embodiments the plurality of polymer spheres 150 may be deposited onto the MIO bonding structure 130, and in particular the first major surface 132, after the opal structure 140 is removed.

At block 210, the plurality of polymer spheres 150 are removed from the assembly 100 to expose the bonding/solder material encapsulated therein, and in particular, the plurality of solder spheres 156 encapsulated within the plurality of polymer spheres 150. It should be understood that the plurality of polymer spheres 150 may be removed from the assembly 100 via various methods, including, but not limited to, dissolving the plurality of polymer spheres 150 with a solution (e.g., a hydrofluoric acid solution) to thereby uncover the solder sphere 156 (FIG. 2C) encapsulated within each of the plurality of polymer spheres 150. Although in the present example the plurality of polymer spheres 150 are described as being removed after a removal of the opal structure 140, it should be understood that in other embodiments the plurality of polymer spheres 150 may be removed from the assembly 100 before and/or simultaneously with the opal structure 140. It should further be understood that in some embodiments both the opal structure 140 and the plurality of polymer spheres 150 may be dissolved with the same solution (e.g., a hydrofluoric acid solution). In this instance, the plurality of solder spheres 156 are disposed along the first major surface 132 of the MIO bonding structure 130 such that the plurality of solder spheres 156 are secured to the MIO bonding structure 130 along a surface of the MIO bonding structure 130 opposite of the substrate 120.

Figure 2D:
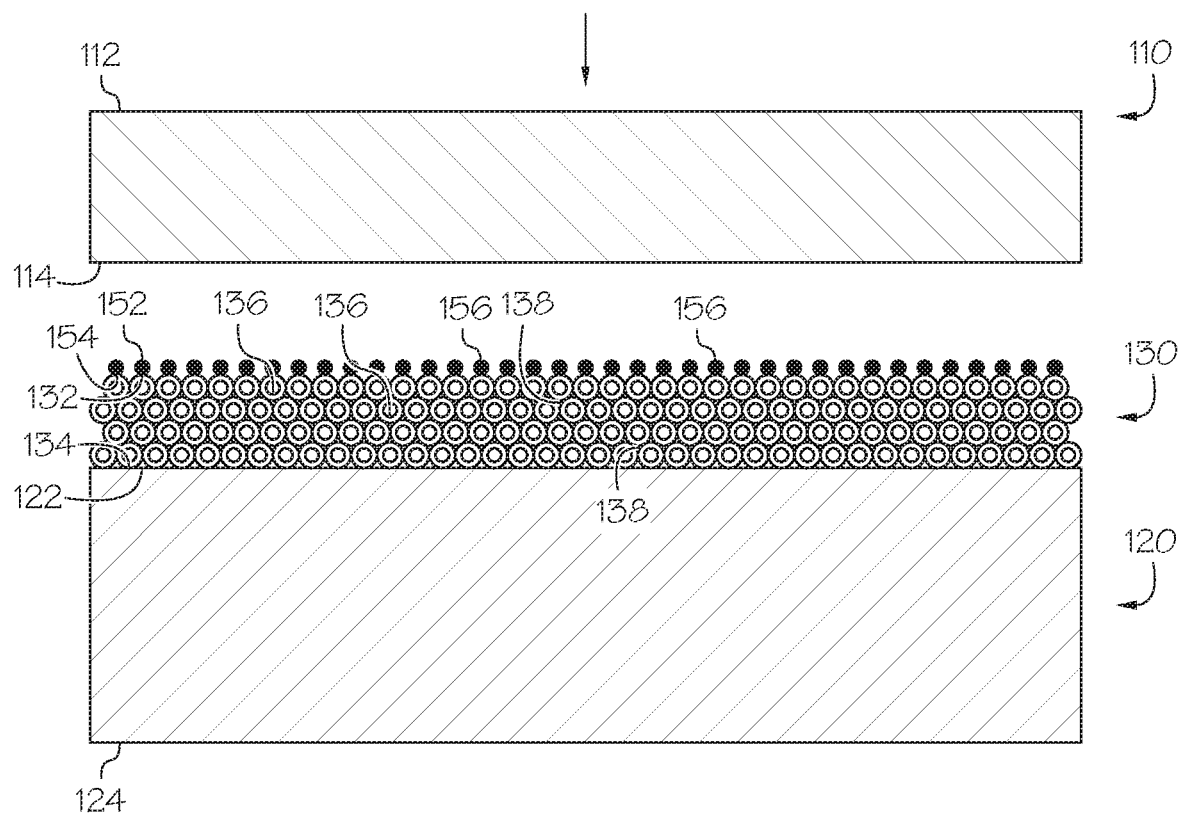
FIG. 2D schematically depicts a method of fabricating the assembly of FIG. 1 by positioning a device substrate against the surface of the metal inverse opal structure including the solder material according to one or more embodiments shown and described herein.

At block 212, and as particularly depicted in FIG. 2D, the semiconductor device 110 may be placed on the MIO bonding structure 130. For instance, the bottom surface 114 of the semiconductor device 110 may be deposited onto the first major surface 132 of the MIO bonding structure 130 adjacent to the plurality of solder spheres 156. In particular, the bottom surface 114 of the semiconductor device 110 is positioned in contact with the plurality of solder spheres 156 extending along the first major surface 132 of the MIO bonding structure 130. It should further be understood that the plurality of solder spheres 156 (and/or the plurality of polymer spheres 150 prior to removal) may be positioned along various other surfaces of the MIO bonding structure 130, the semiconductor device 110, and/or the substrate 120 to effectively bond the semiconductor device 110 to the substrate 120.

At block 214, the semiconductor device 110 may be bonded to the MIO bonding structure 130 via electroplating, thermal bonding, transient liquid phase (TLP) bonding, electrolytic or electroless bonding, and/or the like. It should be understood that TLP bonding may be particularly used in instances where the semiconductor device 110 is a wide bandgap semiconductor device that operates at relatively high temperatures (e.g., at a temperature of about 200° Celsius or greater than about 200° Celsius). This is particularly due to the TLP bond layers being capable of adhering the components of the assembly 100 (i.e., the semiconductor device 110, the MIO bonding structure 130, and/or the substrate 120) at relatively high temperatures better than other layers, such as, for example, a solder layer. It should further be understood that, with the bottom surface 114 of the semiconductor device 110 in contact with the plurality of solder spheres 156 prior to TLP bonding, the plurality of solder spheres 156 are effectively melted during bonding of the assembly 100, thereby adhering the semiconductor device 110 to the first major surface 132 of the MIO bonding structure 130 (FIG. 1).

Figure 2E:
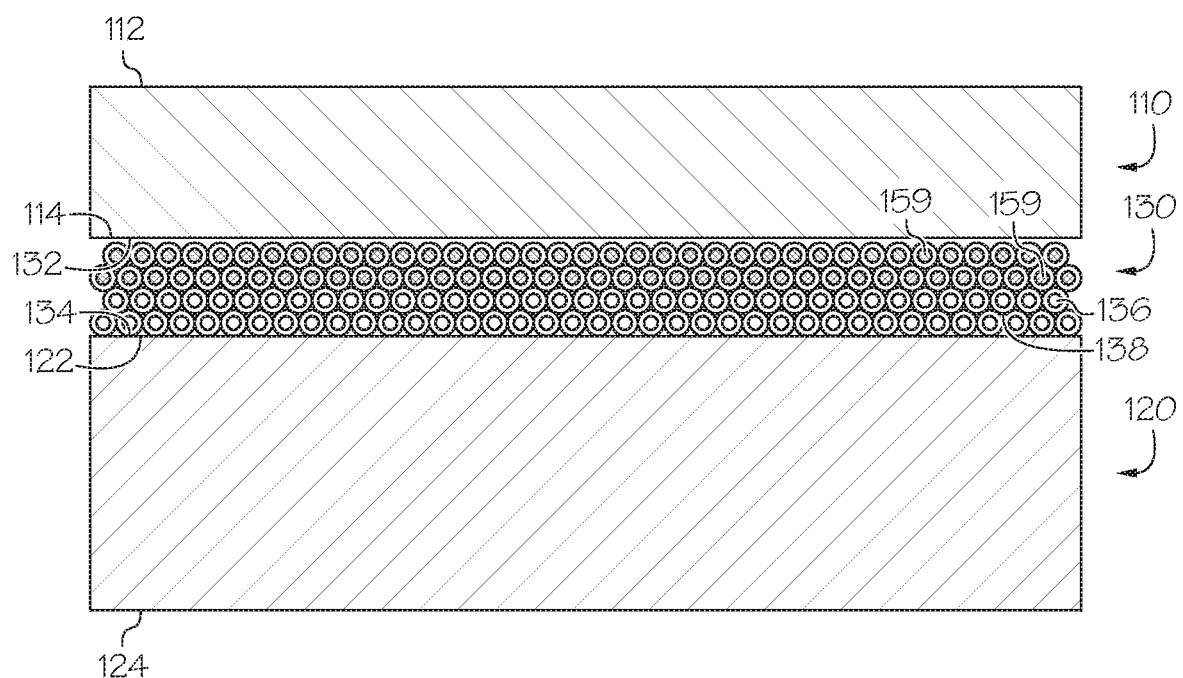
FIG. 2E schematically depicts a method of fabricating the assembly of FIG. 1 by melting the solder material according to one or more embodiments shown and described herein.
Figure 3:
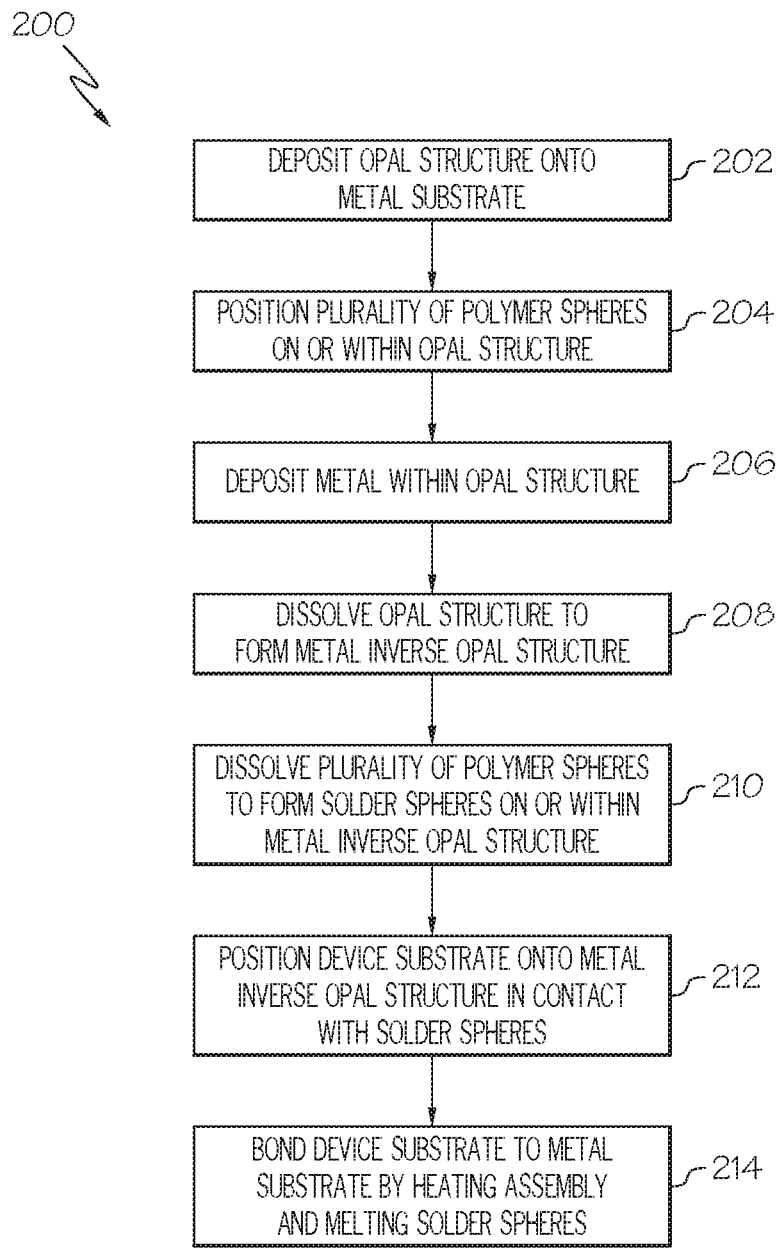
FIG. 3 depicts a flow diagram of an illustrative method of forming the assembly of FIG. 1 according to one or more embodiments shown and described herein.

Referring now to FIG. 2E, the plurality of solder spheres 156 are melted during TLP bonding of the assembly 100 such that a solder material 159 forming the solder spheres 156 are effectively wicked into and transferred through the plurality of pores 136 of the MIO bonding structure 130, via a capillary action, to adhere the semiconductor device 110 to the MIO bonding structure 130. In particular, the semiconductor device 110 is bonded to the MIO bonding structure 130 along the interface extending between the bottom surface 114 of the semiconductor device 110 and the first major surface 132 of the MIO bonding structure 130 where the plurality of solder spheres 156 are positioned. In other words, bonding the assembly 100 causes the plurality of solder spheres 156 to melt between the semiconductor device 110 and the MIO bonding structure 130, which promotes an adhesion of the semiconductor device 110 to the MIO bonding structure 130. To melt the plurality of solder spheres 156, the assembly 100 is heated during TLP bonding to a predetermined temperature that exceeds a melting temperature of the solder material 159 forming the plurality of solder spheres 156.

In the present example, with the plurality of solder spheres 156 formed of tin (i.e., the solder material 159), a melting temperature of the plurality of solder spheres 156 is approximately 230° Celsius such that the assembly 100 is heated to a predetermined temperature greater than at least 230° Celsius during TLP bonding to effectively melt the plurality of solder spheres 156. It should be understood that in response to the plurality of solder spheres 156 melting, the solder material 159 forming the solder spheres 156 (e.g., tin) adheres to the bottom surface 114 of the semiconductor device 110 while being wicked into (i.e., extend through) a portion of the plurality of pores 136 of the MIO bonding structure 130 (FIG. 2E). Accordingly, as a portion of the tin (i.e., the solder material 159) from the plurality of solder spheres 156 contacts the bottom surface 114 of the semiconductor device 110 and a remaining portion of the tin passes through the plurality of pores 136 of the MIO bonding structure 130, the semiconductor device 110 is effectively bonded to the MIO bonding structure 130 upon a cooling of the assembly 100. In other words, with the tin from the plurality of solder spheres 156 received in and integrated through the plurality of pores 136 while in contact with the bottom surface 114 of the semiconductor device 110, a cooling of the tin results in a phase change that provides for the semiconductor device 110 bonding to the MIO bonding structure 130.

It should be understood that the tin from the plurality of solder spheres 156 may extend partially or entirely through a thickness of the MIO bonding structure 130 dependent on various factors, including but not limited to, a quantity of the plurality of solder spheres 156 positioned within the assembly 100. For instance, in the present example, the tin from the plurality of solder spheres 156 is depicted as partially extending into the MIO bonding structure 130 (FIG. 2E) as a result of the number of the plurality of polymer spheres 150 initially deposited in the assembly 100, and the corresponding number of solder spheres 156 encapsulated within the plurality of polymer spheres 150 (FIG. 2D). In other embodiments, additional and/or fewer polymer spheres 150 and/or solder spheres 156 may be included in the assembly 100, and in particular deposited along the MIO bonding structure 130, to provide a greater or lesser quantity of tin extending through the plurality of pores 136 of the MIO bonding structure 130, respectively, in response to melting the plurality of solder spheres 156 during a bonding process of the assembly 100. Additional polymer spheres 150 may be positioned along the first major surface 132, the second major surface 134, and/or along one or more side surfaces of the MIO bonding structure 130 to provide a greater amount of tin received within the MIO bonding structure 130 when bonding the assembly 100 at elevated temperatures, thereby causing the plurality of solder spheres 156 (e.g., tin spheres) to melt and be wicked into the plurality of pores 136.

It should be understood that in some embodiments an intermetallic compound layer and/or bond may be formed between the semiconductor device 110 and the MIO bonding structure 130 along the interface of the bottom surface 114 and the first major surface 132 in response to the plurality of solder spheres 156 melting during the TLP bonding. It should also be understood that in some embodiments, dependent on a location of the plurality of solder spheres 156, melting the plurality of solder spheres 156 may facilitate an adhesion of the substrate 120 to the MIO bonding structure 130. In response to the plurality of solder spheres 156 melting and joining the semiconductor device 110 to the MIO bonding structure 130 and/or the substrate 120 to the MIO bonding structure 130, the assembly 100 is formed as a result.

Figure 4A:
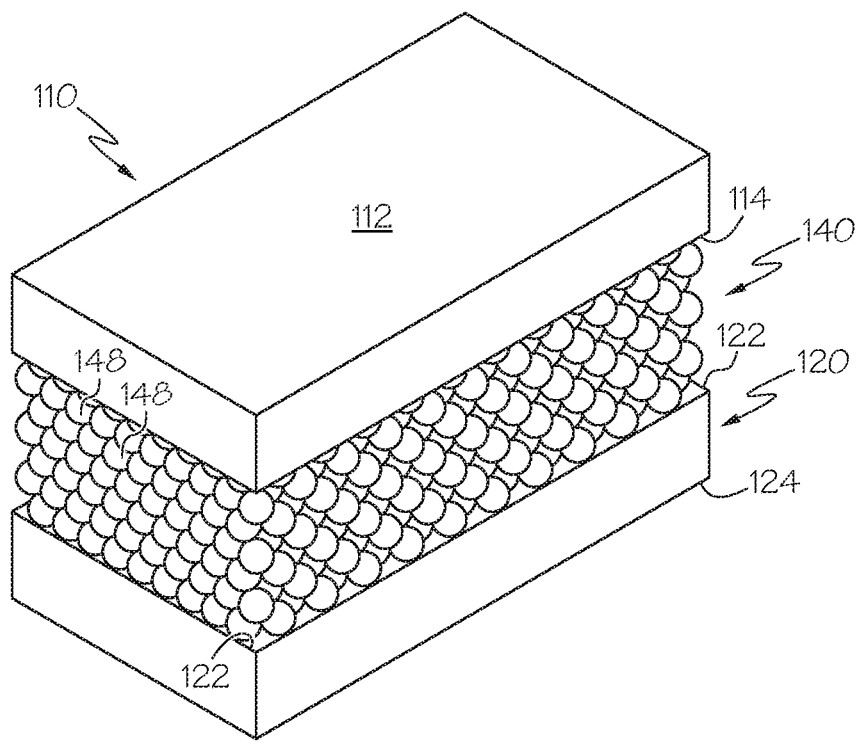
FIG. 4A schematically depicts an illustrative perspective view of another assembly having a metal substrate deposited onto a device substrate with an opal structure disposed therebetween according to one or more embodiments shown and described herein.
Figure 4B:
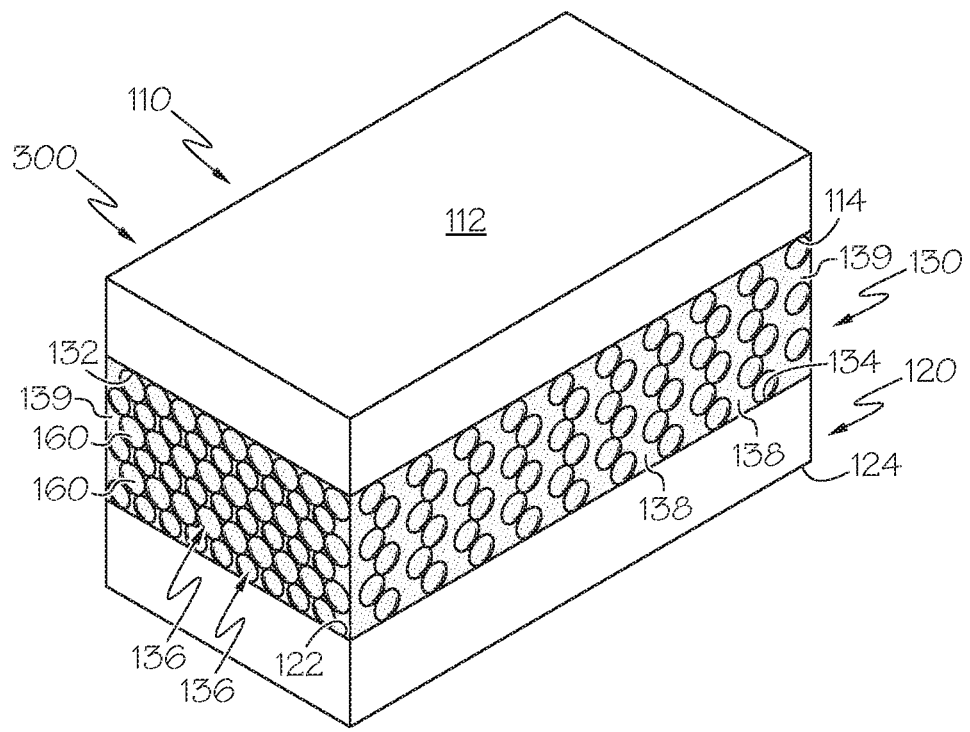
FIG. 4B schematically depicts the assembly of FIG. 4A with the opal structure dissolved to form a metal inverse opal structure with a solder paste extending about an outer lateral surface of the metal inverse opal structure according to one or more embodiments shown and described herein.

Referring now to FIGS. 4A-4B, a non-limiting example of an assembly 300, such as, for example, a power electronics assembly is illustrated. In the example shown, it should be understood that the assembly 300 is substantially similar to the assembly 100 described above such that like reference numerals are used to identify like components. An example method of forming the assembly 300 with the opal structure 140 may be different than the example method 200 shown and described above as explicitly noted herein. For instance, referring to the flow chart of FIG. 5, an example method 400 for forming the assembly 300 is shown. It should be understood that method 400 is merely illustrative and that the assembly 300 may be formed via other methods.

Figure 5:
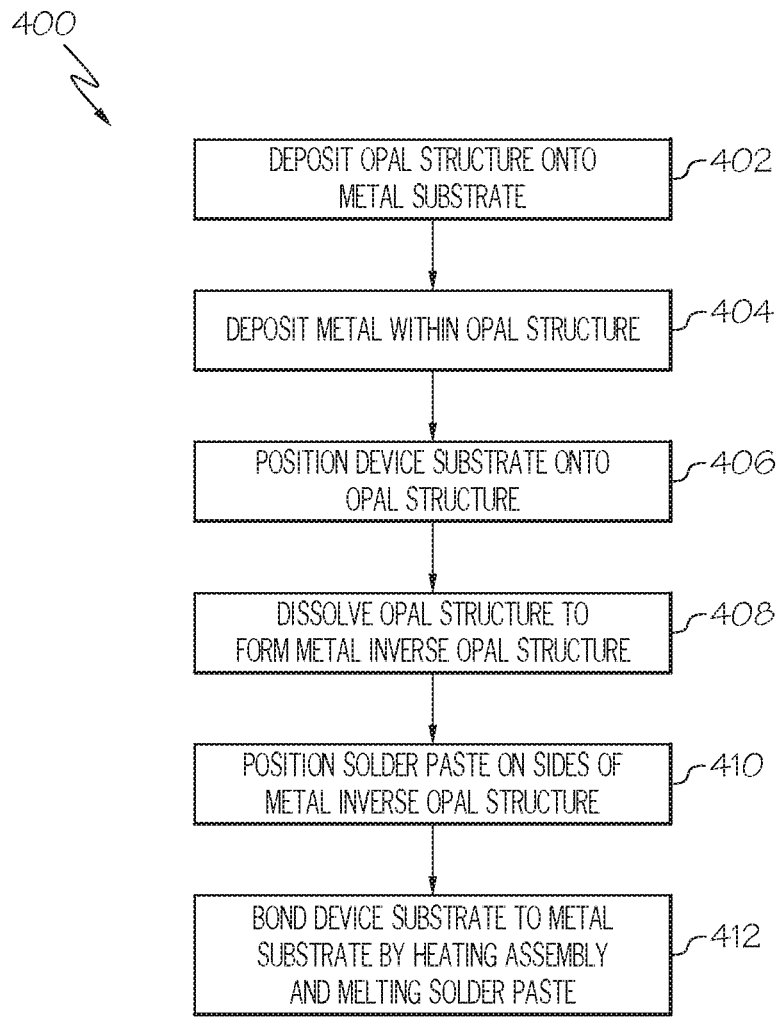
FIG. 5 depicts a flow diagram of an illustrative method of forming the assembly of FIGS. 4A-4B according to one or more embodiments shown and described herein.

Referring to FIGS. 4A and 5, at block 402, the substrate 120 is positioned against the opal structure 140, and in particular, the top surface 122 of the substrate 120 is disposed along the second major surface 144 of the opal structure 140. At block 404, a material (e.g., a metal) may be received within the opal structure 140, and in particular, deposited into the plurality of voids 146 of the opal structure 140 as described in greater detail above. At block 406, the semiconductor device 110 may be placed on the opal structure 140, and in particular, the bottom surface 114 of the semiconductor device 110 may be deposited onto the first major surface 142 of the opal structure 140. In this example, the semiconductor device 110 is deposited onto the first major surface 142 of the opal structure 140 prior to positioning a solder paste 160 on the opal structure 140.

Referring to FIGS. 4B and 5, at block 408, the opal structure 140 is removed to thereby form the MIO bonding structure 130 of the assembly 300. It should be understood that the opal structure 140 may be removed from the assembly 300 via various methods, including those described in greater detail above with respect to assembly 100. At block 410, and as particularly depicted in FIG. 4B, the solder paste 160 is positioned along the sides of the MIO bonding structure 130, and in particular, along an exterior periphery surface of the MIO bonding structure 130 extending between the first major surface 132 and the second major surface 134. In the present example, the solder paste 160 extends along an outer lateral surface 139 of the MIO bonding structure 130 rather than along the first major surface 132 of the MIO bonding structure 130 as described above with respect to the assembly 100 and shown in FIGS. 1-2. It should be understood that the solder paste 160 may extend along additional and/or fewer surfaces or sides of the MIO bonding structure 130 than those shown and described herein. It should also be understood that in some embodiments the solder paste 160 may be positioned along an exterior periphery surface of the opal structure 140, between the first major surface 142 and the second major surface 144, prior to a dissolution of the opal structure 140.

Unlike the method 200 described and shown above, which included the solder spheres 156 formed of solder material 159 that is encapsulated within the plurality of polymer spheres 150, in the present example method 400 the solder paste 160 of the assembly 300 is already exposed such that a dissolution to expose the solder material of the solder paste 160 is not required in the present example. Accordingly, it should be understood that the solder paste 160 of the present example is already positioned along the MIO bonding structure 130 and adjacent to the bottom surface 114 of the semiconductor device 110 such that an additional process of exposing a solder material (e.g., tin) of the solder paste 160 is not necessary in the example method 400 shown and described herein.

Referring to FIG. 5, at block 412, the semiconductor device 110 may be bonded to the MIO bonding structure 130 via electroplating, thermal bonding, transient liquid phase (TLP) bonding, electrolytic or electroless bonding, and/or the like. In this instance, the solder paste 160 is melted and wicked into (i.e., transferred through) the plurality of pores 136 of the MIO bonding structure 130 during the bonding process (e.g., TLP bonding) due to the position of the solder paste 160 along the sides of the MIO bonding structure 130 to adhere the semiconductor device 110 to the MIO bonding structure 130 along the interface extending between the bottom surface 114 of the semiconductor device 110 and the first major surface 132 of the MIO bonding structure 130. As described in greater detail above with respect to the assembly 100 and method 200, bonding the assembly 300 causes the solder paste 160 to melt, which promotes an adhesion of the semiconductor device 110 to the MIO bonding structure 130 thereby forming the assembly 300. In the present example, the inclusion of the solder paste 160 along multiple outer, side surfaces 139 of the MIO bonding structure 130 promotes adhesion of the semiconductor device 110 to the MIO bonding structure 130 by extracting the material that the solder paste 160 is formed of (e.g., tin) into the plurality of pores 136 of the MIO bonding structure 130 via a capillary action and thereby exposing the semiconductor device 110 to the solder material (e.g., tin) along the bottom surface 114 during the bonding process. In other words, as the solder paste 160 melts the material of the solder paste 160 is drawn into the plurality of pores 136 of the MIO bonding structure 130 via a capillary action, which further contacts the bottom surface 114 of the semiconductor device 110 due to the semiconductor device 110 being deposited along the first major surface 132 of the MIO bonding structure 130. With the material of the solder paste 160 (e.g., tin) received in and integrated through the plurality of pores 136 while in contact with the bottom surface 114 of the semiconductor device 110, a cooling of the tin results in a phase change that provides for the semiconductor device 110 bonding to the MIO bonding structure 130.

Figure 6A:
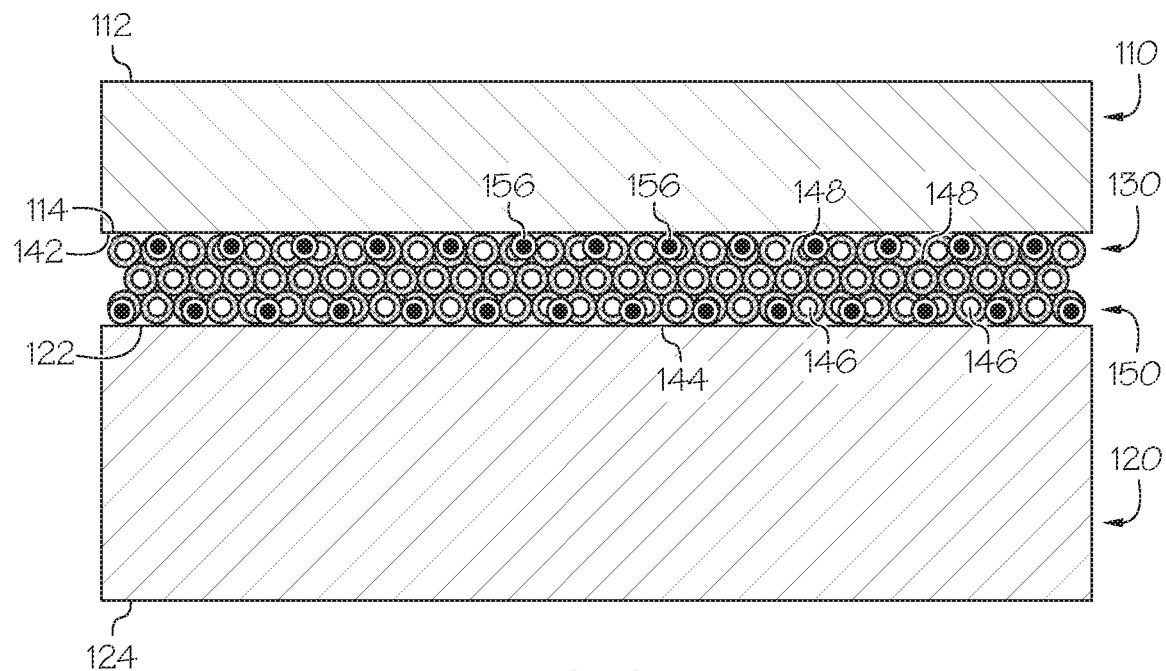
FIG. 6A schematically depicts an illustrative cross-sectional side view of yet another assembly having a metal substrate thermally bonded to a device substrate with a metal inverse opal structure disposed therebetween and including a plurality of polymer spheres therein according to one or more embodiments shown and described herein.
Figure 6B:
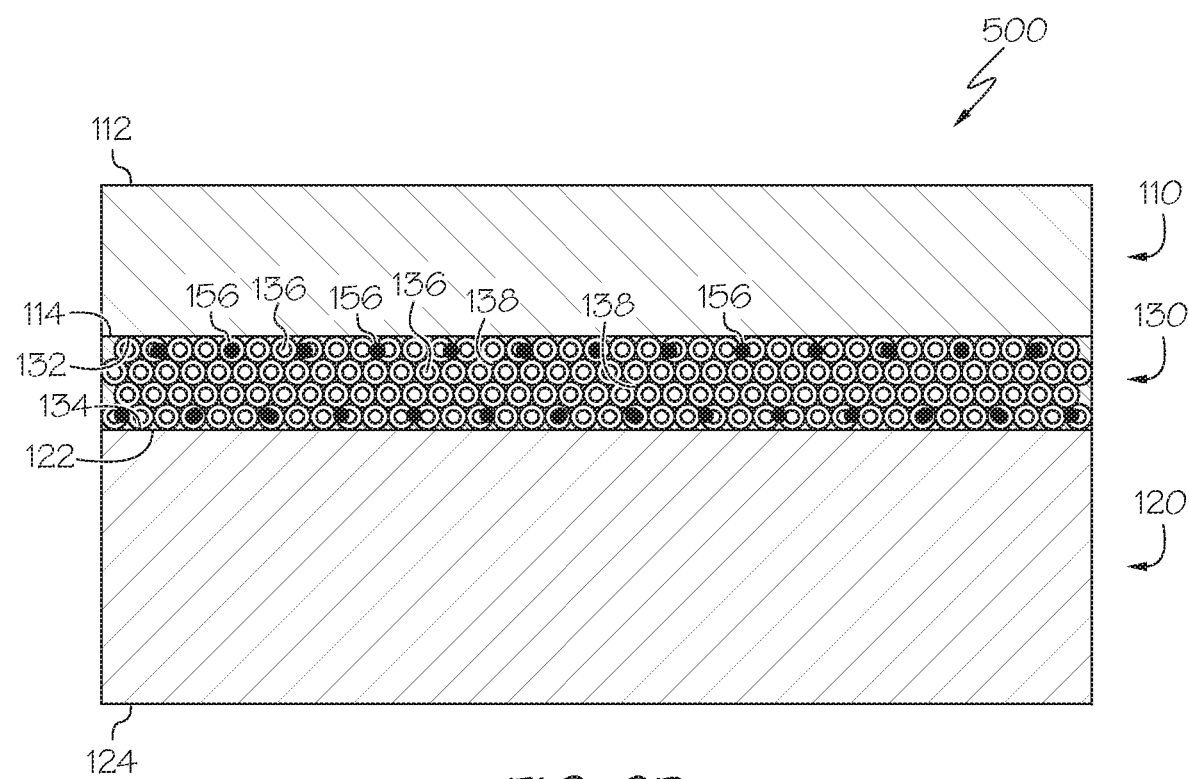
FIG. 6B schematically depicts the assembly of FIG. 6A with the plurality of polymer spheres dissolved to form a plurality of solder spheres disposed within the metal inverse opal structure according to one or more embodiments shown and described herein.

Referring now to FIGS. 6A-6B, a non-limiting example of an assembly 500, such as, for example, a power electronics assembly is illustrated. In the example shown, it should be understood that the assembly 500 is substantially similar to the assembly 100 described above such that like reference numerals are used to identify like components. Rather, an example method of forming the assembly 500 with the opal structure 140 may be different than the example method 200 shown and described above. For instance, referring to the flow chart of FIG. 7, an example method 600 for forming the assembly 500 is shown. It should be understood that method 600 is merely illustrative and that the assembly 500 may be formed via other methods.

Figure 7:
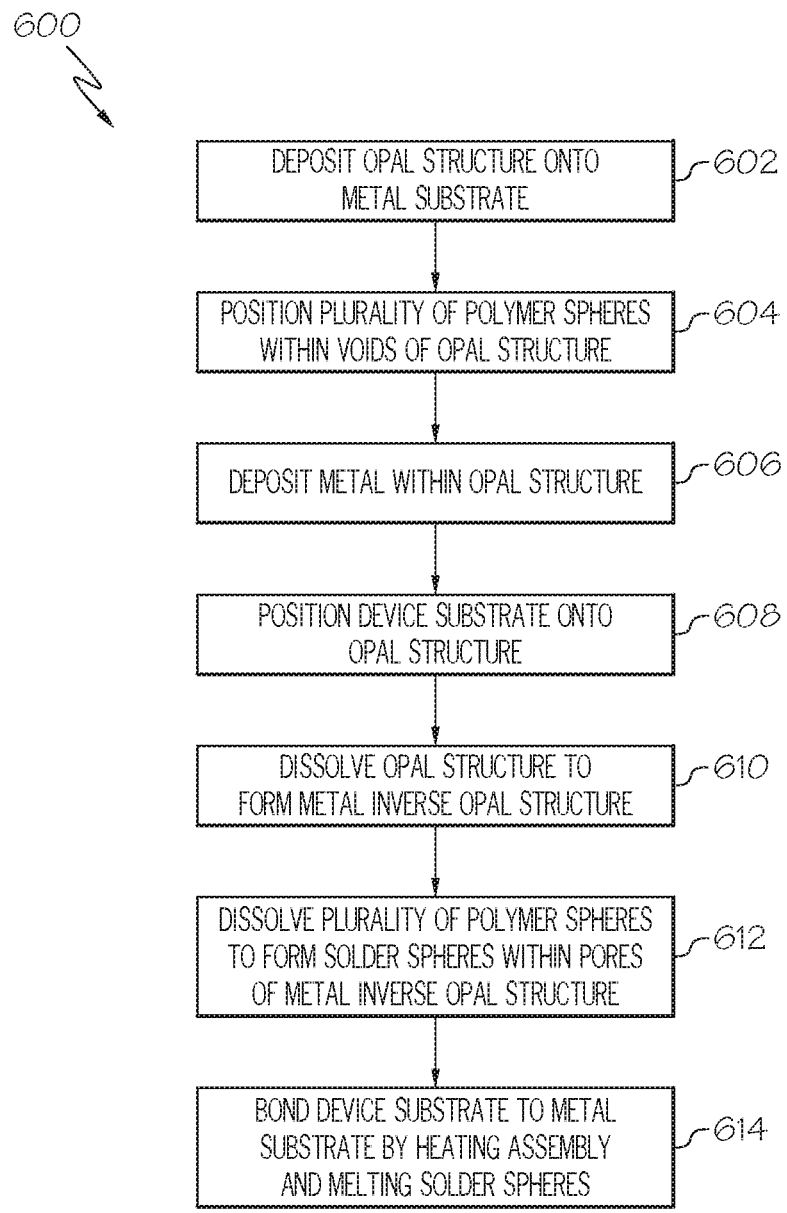
FIG. 7 depicts a flow diagram of an illustrative method of forming the assembly of FIGS. 6A-6B according to one or more embodiments shown and described herein.

Referring to FIGS. 6A and 7, at block 602, the substrate 120 is positioned against the opal structure 140, and in particular, the top surface 122 of the substrate 120 is disposed along the second major surface 144 of the opal structure 140. At block 604, and as particularly depicted in FIG. 6A, the plurality of polymer spheres 150 are positioned within the opal structure 140 rather than along the first major surface 142 of the opal structure 140 as described above with respect to the assembly 100 and shown in FIGS. 1-2 and/or along a periphery of the opal structure 140 as described above with respect to assembly 300 and shown in FIGS. 4A-4B. In particular, the plurality of polymer spheres 150 are positioned in the plurality of voids 146 of the opal structure 140 such that the plurality of polymer spheres 150 are disposed between the first major surface 142 and the second major surface 144 of the opal structure 140. It should be understood that the plurality of polymer spheres 150 may be dispersed throughout the porous structure of the opal structure 140 such that the plurality of solder spheres 156 encapsulated within the plurality of polymer spheres 150 are evenly and/or randomly distributed throughout the plurality of voids 146. It should be understood that the plurality of polymer spheres 150 may be positioned along additional and/or fewer areas and/or surfaces of the opal structure 140 than those shown and described herein. For example, the polymer spheres may be in the form of a continuous, thin layer extending through the opal structure 140, rather than in the form of a plurality of spheres as shown and described herein. In this instance, it should be understood that the polymer layer still encapsulates a solder material therein (e.g., tin) and may extend through a longitudinal length of the opal structure 140 along various sizes, shapes, and/or configurations without departing from the scope of the present disclosure.

At block 606, a material (e.g., a metal) may be received within the opal structure 140, and in particular, deposited into the plurality of voids 146 of the opal structure 140 as described in greater detail above. It should be understood that a portion of the material may be received within the plurality of voids 146 of the opal structure 140 that do not include the plurality of polymer spheres 150 therein. At block 608, the semiconductor device 110 may be placed on the opal structure 140, and in particular, the bottom surface 114 of the semiconductor device 110 may be deposited onto the first major surface 142 of the opal structure (FIG. 6A). In this example, the semiconductor device 110 is deposited onto the first major surface 142 of the opal structure 140 after positioning the plurality of polymer spheres 150 within opal structure 140. It should be understood that in other embodiments the semiconductor device 110 may be deposited onto the opal structure 140 prior to depositing the plurality of polymer spheres 150 within the plurality of voids 146 of the opal structure 140. It should also be understood that in some embodiments the plurality of polymer spheres 150 may be received within the opal structure 140 after the semiconductor device 110 is deposited onto the opal structure 140.

Referring to FIGS. 6B and 7, at block 610, the opal structure 140 is removed to thereby form the MIO bonding structure 130 of the assembly 500. It should be understood that the opal structure 140 may be removed from the assembly 500 via various methods, including those described in greater detail above with respect to assembly 100. At block 612, the plurality of polymer spheres 150 are removed from the assembly 500 to expose the plurality of solder spheres 156 encapsulated therein. It should be understood that the plurality of polymer spheres 150 may be removed from the assembly 500 via various methods, including those described in greater above, such as by a solution (e.g., hydrofluoric acid solution). In the present example, with the plurality of polymer spheres 150 deposited within the plurality of voids 146 of the opal structure 140, dissolving the plurality of polymer spheres 150 after removing the opal structure 140 thereby forms the plurality of solder spheres 156 within the plurality of pores 136 of the MIO bonding structure 130, as depicted in FIG. 6B. In other words, upon removing the opal structure 140 and the plurality of polymer spheres 150 in accordance with the steps described above and shown herein, the plurality of solder spheres 156 formed in response to removing the plurality of polymer spheres 150 are exposed and positioned within the plurality of pores 136 of the MIO bonding structure 130 (as formed in response to removing the opal structure 140).

It should be understood that the plurality of solder spheres 156 may be dispersed throughout the porous structure of the MIO bonding structure 130 such that the plurality of solder spheres 156 are evenly and/or randomly distributed throughout the plurality of pores 136. In the present example, the inclusion and distribution of the plurality of solder spheres 156 within multiple pores 136 of the MIO bonding structure 130 serves to promote adhesion of the semiconductor device 110 to the MIO bonding structure 130 by contacting a greater surface area of the bottom surface 114 of the semiconductor device 110 to the first major surface 132 of the MIO bonding structure 130 when the plurality of solder spheres 156 are melted during a bonding process of the assembly 500. Additionally, in some embodiments the plurality of polymer spheres 150 may further extend along the first major surface 142 of the opal structure 140, in addition to being received within the plurality of voids 146, such that removing the plurality of polymer spheres 150 forms the plurality of solder spheres 156 throughout the MIO bonding structure 130 and along the first major surface 132. It should be understood that the plurality of polymer spheres 150 may be received within a predetermined set of the plurality of voids 146 of the opal structure 140 such that the plurality of solder spheres 156 are formed in a corresponding, predetermined pattern throughout the network of the plurality of pores 136 of the MIO bonding structure 130.

As further seen in FIG. 6B, the plurality of solder spheres 156 are deposited in proximate contact with the semiconductor device 110 and in direct contact with the MIO bonding structure 130. Although the plurality of solder spheres 156 of the assembly 500 are described herein in the present example method 600 as being formed after removing the opal structure 140 to form the MIO bonding structure 130, it should be understood that in some embodiments the plurality of polymer spheres 150 may be removed before and/or simultaneously with a removal of the opal structure 140.

Referring to FIGS. 6B and 7, at block 614, the semiconductor device 110 may be bonded to the MIO bonding structure 130 via electroplating, thermal bonding, transient liquid phase (TLP) bonding, electrolytic or electroless bonding, and/or the like. In this instance, the plurality of solder spheres 156 are melted from within the plurality of pores 136 of the MIO bonding structure 130 during the bonding process (e.g., TLP bonding) due to the position of the plurality of solder spheres 156. With the semiconductor device 110 positioned against the first major surface 132 of the MIO bonding structure 130 in close proximity to the plurality of pores 136, the material composing the plurality of solder spheres 156 (e.g., tin) serves to adhere the semiconductor device 110 to the MIO bonding structure 130 along the interface extending between the bottom surface 114 of the semiconductor device 110 and the first major surface 132 of the MIO bonding structure 130 during a bonding of the assembly 500. As described in greater detail above with respect to the assembly 100 and method 200, bonding the assembly 500 causes the plurality of solder spheres 156 to melt, which promotes an adhesion of the semiconductor device 110 to the MIO bonding structure 130 thereby forming the assembly 500. In the present example, the distribution of the plurality of solder spheres 156 throughout the porous structure of the MIO bonding structure 130 promotes adhesion of the semiconductor device 110 to the MIO bonding structure 130 by exposing a greater surface area of the semiconductor device 110 to the material of the solder spheres 156 (e.g., tin) received within the MIO bonding structure 130 during the bonding process.

It should now be understood that the methods for fabricating a power electronic assembly, and in particular bonding a semiconductor device to a metal substrate with a metal inverse opal structure disposed therebetween, may be utilized to bond the components of an assembly together without the need for additional interface and/or bonding layers in the resulting assembly structure. In particular, the integration of one or more solder spheres encapsulated within a dissolvable, polymer sphere in the fabrication method described herein may provide a simplified process for securing assembly components to a porous interlayer (e.g., an MIO bonding structure) that includes a plurality of pores/voids capable of reducing thermally induced stresses of the assembly during operation.

It is noted that the term "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue. The terms "top", "bottom" and "middle" are used in relation to the figures and are not meant to define an exact orientation of power electronics assemblies or layers used to form power electronic assemblies described herein.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of forming a bonding assembly, the method comprising:
    positioning a plurality of polymer spheres against an opal structure, the opal structure comprising a first major surface and a second major surface with a plurality of voids defined therebetween, wherein each of the plurality of polymer spheres encapsulates a solder material disposed therein and contacts the first major surface of the opal structure;
    placing a substrate against the second major surface of the opal structure;
    depositing a material within the voids of the opal structure;
    removing the opal structure to form an inverse opal structure between the first and second major surfaces;

removing the plurality of polymer spheres to expose the solder material encapsulated therein; and placing a semiconductor device onto the inverse opal structure in contact with the solder material.

2. The method of claim 1, wherein removing the plurality of polymer spheres and the opal structure comprises dissolving the plurality of polymer spheres and the opal structure with a solution.

3. The method of claim 2, wherein the solution is a hydrofluoric acid solution.

4. The method of claim 2, wherein dissolving the opal structure with the solution causes a plurality of dimples and a plurality of pores to form the inverse opal structure.

5. The method of claim 1, wherein the plurality of polymer spheres is positioned against the opal structure after disposing the substrate against the opal structure.

6. The method of claim 1, wherein disposing the substrate against the opal structure comprises electrodepositing the substrate onto the opal structure.

7. The method of claim 1, further comprising bonding the semiconductor device to the inverse opal structure by melting the solder material disposed therebetween.

8. The method of claim 1, wherein the material comprises a metal.

9. The method of claim 1, wherein the solder material encapsulated within the plurality of polymer spheres is formed of a bonding material that is different than the plurality of polymer spheres.

10. The method of claim 9, wherein the bonding material comprises tin.

11. The method of claim 1, further comprising positioning the plurality of polymer spheres around an outer surface of the inverse opal structure.

12. The method of claim 1, further comprising positioning the plurality of polymer spheres around an outer surface of the opal structure after depositing the semiconductor device onto the opal structure.

13. The method of claim 1, further comprising disposing the plurality of polymer spheres within the plurality of voids of the opal structure.

14. The method of claim 13, wherein removing the opal structure and the plurality of polymer spheres comprises forming the inverse opal structure with the solder material disposed therein.

15. A method of forming a power electronic assembly comprising:

attaching a metal substrate to a first surface of an opal structure, the opal structure comprising a plurality of voids defined between the first surface and a second surface;

attaching a plurality of polymer spheres to the second surface of the opal structure, the plurality of polymer spheres encapsulating a solder material disposed therein;

forming an inverse opal structure between the metal substrate and the plurality of polymer spheres by removing the opal structure disposed therebetween;

exposing the solder material from within the plurality of polymer spheres by removing the plurality of polymer spheres; and securing a non-metal substrate against the inverse opal structure and in contact with the solder material.

16. The method of claim 15, attaching the non-metal substrate to the inverse opal structure by melting the solder material disposed therebetween.

17. The method of claim 16, wherein the solder material encapsulated within the plurality of polymer spheres is formed of tin such that melting the solder material comprises liquefying tin between the non-metal substrate and the inverse opal structure.

18. A method for bonding a semiconductor device to a substrate using metal inverse opals, the method comprising:

depositing the substrate onto a first major surface of an opal structure, the opal structure defining a plurality of voids between the first major surface and a second major surface of the opal structure;

receiving a plurality of polymer spheres within at least one of the plurality of voids of the opal structure;

electrodepositing metal within the plurality of voids of the opal structure to bond the substrate to the opal structure;

dissolving the opal structure to provide a metal inverse opal structure secured along the substrate, the metal inverse opal structure defining a plurality of spheres; and dissolving the plurality of polymer spheres from within the metal inverse opal structure to expose an encapsulated material positioned within the plurality of polymer spheres; and depositing the semiconductor device onto the metal inverse opal structure to bond the substrate to the semiconductor device.

19. The method of claim 18, further comprising melting the encapsulated material from within the plurality of spheres of the metal inverse opal structure to secure the semiconductor device to the substrate.

20. The method of claim 18, wherein the encapsulated material comprises tin.

* * * * *